US011258422B2

(12) United States Patent
Yokoyama

(10) Patent No.: US 11,258,422 B2
(45) Date of Patent: Feb. 22, 2022

(54) COMMUNICATION MODULE

(71) Applicant: Murata Manufacturing Co., Ltd., Kyoto (JP)

(72) Inventor: Jin Yokoyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 90 days.

(21) Appl. No.: 16/724,956

(22) Filed: Dec. 23, 2019

(65) Prior Publication Data

US 2020/0127630 A1   Apr. 23, 2020

Related U.S. Application Data

(63) Continuation of application No. PCT/JP2018/020914, filed on May 31, 2018.

(30) Foreign Application Priority Data

Jun. 27, 2017   (JP) ............................. JP2017-124805

(51) Int. Cl.
*H03H 7/46*   (2006.01)
*H03F 3/195*   (2006.01)
*H03H 7/01*   (2006.01)
*H03H 7/48*   (2006.01)

(52) U.S. Cl.
CPC .............. *H03H 7/465* (2013.01); *H03F 3/195* (2013.01); *H03H 7/0153* (2013.01); *H03H 7/482* (2013.01); *H03F 2200/294* (2013.01)

(58) Field of Classification Search
CPC ............ H03H 7/465; H03H 7/46; H03H 7/48; H03H 7/482; H03H 7/0153; H03F 3/195; H03F 2200/294
See application file for complete search history.

(56) References Cited

U.S. PATENT DOCUMENTS

| 2005/0195047 A1* | 9/2005 | Park | H03H 9/706 |
| | | | 333/133 |
| 2011/0279193 A1 | 11/2011 | Furutani | |
| 2013/0250820 A1* | 9/2013 | Khlat | H04B 1/0057 |
| | | | 370/280 |
| 2013/0272176 A1 | 10/2013 | Uejima | |

(Continued)

FOREIGN PATENT DOCUMENTS

| JP | 2010-178014 A | 8/2010 |
| JP | 2014-039265 A | 2/2014 |

(Continued)

OTHER PUBLICATIONS

International Search Report for International Application No. PCT/JP2018/020914 dated Aug. 21, 2018.

(Continued)

*Primary Examiner* — Robert J Pascal
*Assistant Examiner* — Kimberly E Glenn
(74) *Attorney, Agent, or Firm* — Pearne & Gordon LLP

(57) ABSTRACT

A communication module includes an input/output switch, a duplexer, a transmit filter, and a receive filter. In the duplexer, a second side is disposed at a position farther from the input/output switch than a first side in a second direction orthogonal to a first direction. Any one of the transmit filter and the receive filter is disposed adjacent to the input/output switch in the first direction.

14 Claims, 8 Drawing Sheets

(56) References Cited

U.S. PATENT DOCUMENTS

| 2014/0056183 A1 | 2/2014 | Nakamura et al. |
| 2014/0347145 A1 | 11/2014 | Nakamura et al. |
| 2014/0355456 A1 | 12/2014 | Jiang et al. |
| 2015/0303971 A1 | 10/2015 | Reisner et al. |
| 2016/0365889 A1 | 12/2016 | Weissman et al. |
| 2017/0194993 A1 | 7/2017 | Watanabe |

FOREIGN PATENT DOCUMENTS

| JP | 2014-042094 A | 3/2014 |
| JP | 2017-098630 A | 6/2017 |
| KR | 10-2011-0096594 A | 8/2011 |
| WO | 2010/087307 A1 | 8/2010 |
| WO | 2012/093539 A1 | 7/2012 |
| WO | 2013/047357 A1 | 4/2013 |

OTHER PUBLICATIONS

Written Opinion for International Application No. PCT/JP2018/020914 dated Aug. 21, 2018.
Office Action for Korean Patent Application No. 10-2019-7035046 dated Sep. 14, 2020.

* cited by examiner

COMMUNICATION MODULE

This is a continuation of International Application No. PCT/JP2018/020914 filed on May 31, 2018 which claims priority from Japanese Patent Application No. 2017-124805 filed on Jun. 27, 2017. The contents of these applications are incorporated herein by reference in their entireties.

BACKGROUND

Technical Field

The present disclosure relates to a communication module.

Recently, communication modules mounted, for example, in communication mobile terminals have been demanded to have capability of communication in multiple frequency bands. This demand and reduction in size of communication mobile terminals provide improvement in the density of circuits. However, a communication module having a high density may have reduced isolation characteristics due to a transmit path for transmit signals which is disposed close to that for receive signals.

For example, a communication module disclosed in Patent Document 1 has a transmit filter, which is disposed along a first side of the module substrate, and a receive filter, which is disposed along a second side of the module substrate that is opposite the first side, achieving suppression of degradation of the isolation characteristics.

Patent Document 1: International Publication No. 2010/087307

BRIEF SUMMARY

However, a communication module, which achieves a reduction in the number of discrete components through use of a duplexer in which a transmit filter and a receive filter are integrated, fails to have such an arrangement that, as disclosed in Patent Document 1, the transmit filter is disposed far from the receive filter. In other words, a communication module including a duplexer has an issue in that degradation of the isolation characteristics fails to be suppressed.

The present disclosure provides a communication module that achieves improvement of the isolation characteristics.

A communication module according to an aspect of the present disclosure includes an input/output switch, a duplexer, a transmit filter, and a receive filter. The input/output switch switches between signal paths for transmit signals and receive signals in accordance with frequency bands of the transmit signals and the receive signals. The duplexer has a first side and a second side parallel to each other in a first direction, and includes a first switching terminal, a first transmit terminal, and a first receive terminal. The first switching terminal is disposed on a side of the first side. The first transmit terminal is disposed on a side of the second side. The first receive terminal is disposed on the side of the second side. A signal of a first transmit frequency included in a first frequency band is output from the first switching terminal to the input/output switch. The signal of the first transmit frequency is obtained from a first transmit signal that is input to the first transmit terminal. A signal of a first receive frequency included in the first frequency band is output from the first receive terminal. The signal of the first receive frequency is obtained from a first receive signal that is input from the input/output switch to the first switching terminal. The transmit filter includes a second switching terminal and a second transmit terminal. A signal of a second transmit frequency included in a second frequency band is output from the second switching terminal to the input/output switch. The signal of the second transmit frequency is obtained from a second transmit signal that is input to the second transmit terminal. The receive filter includes a third switching terminal and a second receive terminal. A signal of a second receive frequency included in the second frequency band is output from the second receive terminal. The signal of the second receive frequency is obtained from a second receive signal that is input from the input/output switch to the third switching terminal. In the duplexer, the second side is disposed at a position farther from the input/output switch than the first side in a second direction orthogonal to the first direction. A first filter is disposed adjacent to the input/output switch in the first direction. The first filter is any one of the transmit filter and the receive filter.

The present disclosure may provide a communication module which achieves improvement of the isolation characteristics.

In one aspect of the present disclosure, a communication module comprises a first switch; a duplexer comprising a switching terminal, a first transmit terminal, and a first receive terminal, the first switching terminal being electrically connected to the first switch; a transmit filter electrically connected to the first switch; and a receive filter electrically connected to the first switch. The duplexer has a first side and a second side parallel to each other in a first direction. The first transmit terminal and the first receive terminal are disposed closer to the second side than the first side. The switching terminal is disposed closer to the first side than the second side. In the communication module, the first switch is disposed closer to the first side than the second side in a second direction orthogonal to the first direction. A first of the transmit filter or the receive filter is disposed adjacent to the first switch in the first direction.

In one aspect of the present disclosure, each of the duplexer, the transmit filter, and the receive filter are embodied as individual integrated circuit chips.

In one aspect of the present disclosure, a second of the transmit filter or the receive filter is disposed in the second direction relative to the first switch.

In one aspect of the present disclosure, the receive filter is disposed on an opposite side of the duplexer than the transmit filter.

In one aspect of the present disclosure, the communication module of the present disclosure further comprises a transmit switch configured to output a first transmit signal to the first transmit terminal of the duplexer, or to output a second transmit signal to the transmit filter; and a receive switch configured to receive a signal in a first receive frequency from the first receive terminal of the duplexer, or to receive a signal in a second receive frequency from the receive filter. The transmit filter and the transmit switch are disposed in the first direction relative to the first switch. The receive filter and the receive switch are disposed in the second direction relative to the first switch.

In one aspect of the present disclosure, the transmit filter has a third side and a fourth side parallel to each other in the second direction, and comprises a second transmit terminal electrically connected to the first switch. A second switching terminal is disposed closer to the third side than the fourth side. The second transmit terminal is disposed closer to the fourth side than the third side.

In one aspect of the present disclosure, the second transmit terminal is disposed at an end of the fourth side.

In one aspect of the present disclosure, the receive filter has a fifth side and a sixth side parallel to each other in the first direction, and comprises a second receive terminal electrically connected to the first switch. A third switching terminal is disposed closer to the fifth side than the sixth side. The second receive terminal is disposed closer to the sixth side than the fifth side. In the communication module, the first switch is disposed closer to the fifth side than the sixth side in the second direction.

In one aspect of the present disclosure, the the second receive terminal is disposed at an end of the sixth side.

In one aspect of the present disclosure, the communication module of the present disclosure further comprises a receive switch configured to receive a signal in a first receive frequency from the duplexer, or to receive a signal in a second receive frequency from the receive filter; and a low noise amplifier circuit configured to amplify a signal transmitted from the receive switch, wherein, in the communication module, the duplexer is disposed between the first switch, and the receive switch and the low noise amplifier circuit.

In one aspect of the present disclosure, the duplexer is disposed in the second direction relative to the transmit filter.

In one aspect of the present disclosure, the communication module of the present disclosure further comprises a second duplexer disposed in the second direction relative to the transmit filter.

In one aspect of the present disclosure, the communication module of the present disclosure further comprises a matching circuit disposed adjacent, in the first direction, to a side of the first switch opposite a side adjacent to the first of the transmit filter or the receive filter.

In one aspect of the present disclosure, a communication module comprises an input/output switch configured to selectively switch signal paths for transmit signals and receive signals in accordance with frequency bands of the transmit signals and the receive signals; a duplexer that has a first side and a second side parallel to each other in a first direction, and that comprises a first switching terminal, a first transmit terminal, and a first receive terminal, the first switching terminal being disposed along the first side, the first transmit terminal being disposed along the second side, and the first receive terminal being disposed along the second side, wherein a first transmit signal of a first transmit frequency included in a first frequency band is input to the first transmit terminal and output from the first switching terminal to the input/output switch, and wherein a first receive signal of a first receive frequency included in the first frequency band is input from the input/output switch to the first switching terminal and output from the first receive terminal; a transmit filter comprising a second switching terminal and a second transmit terminal, wherein a second transmit signal of a second transmit frequency included in a second frequency band is input to the second transmit terminal and output from the second switching terminal to the input/output switch; and a receive filter comprising a third switching terminal and a second receive terminal. A second receive signal of a second receive frequency included in the second frequency band is input from the input/output switch to the third switching terminal output from the second receive terminal. In the communication module, the input/output switch is disposed closer to the first side than the second side in a second direction orthogonal to the first direction. In the communication module, the transmit filter or the receive filter is disposed adjacent to the input/output switch in the first direction.

DETAILED DESCRIPTION

Figure 1:
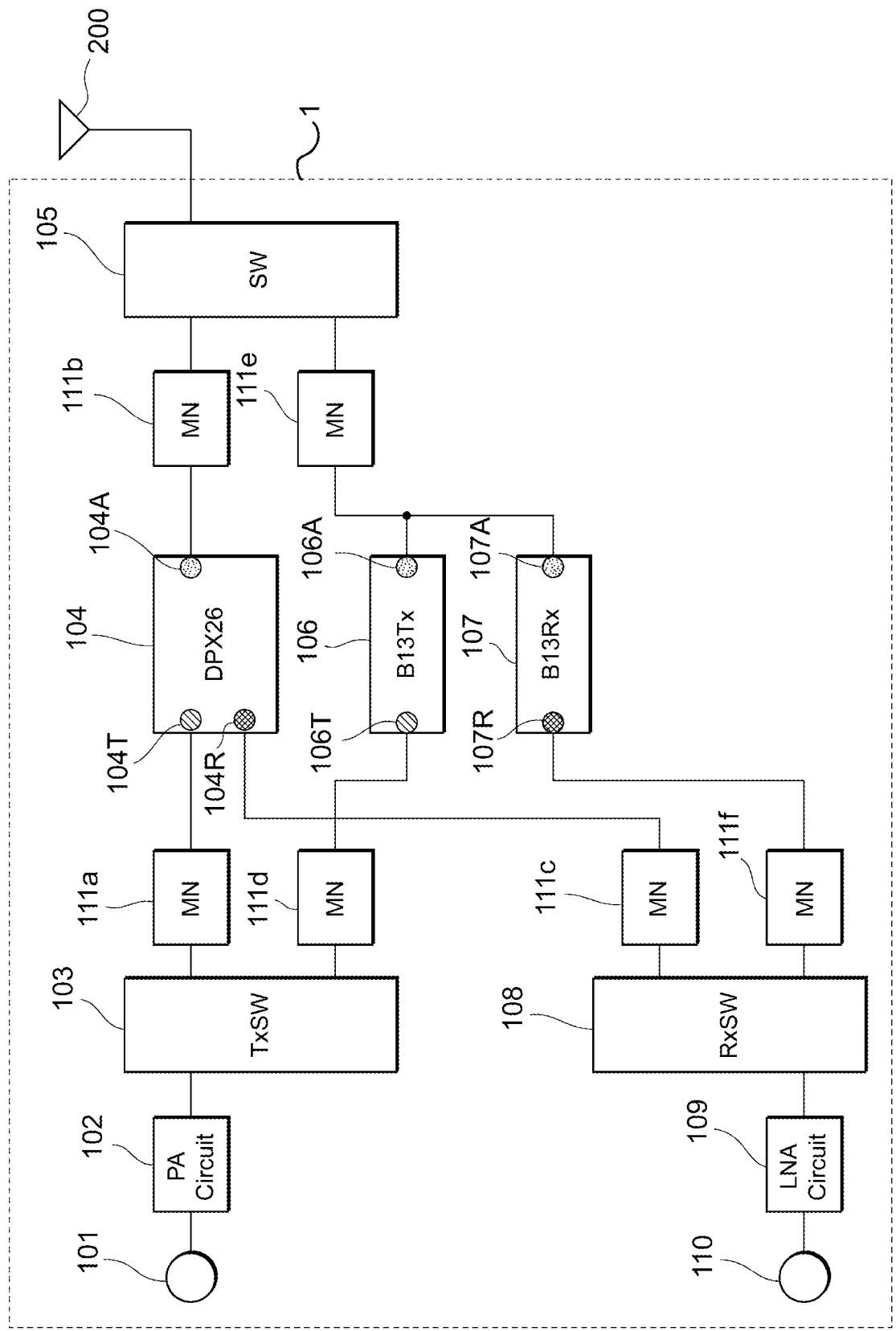
FIG. 1 is a diagram illustrating an exemplary circuit configuration of a communication module according to the present embodiment.

Referring to the accompanying drawings, an embodiment of the present disclosure will be described. In each figure, components, which are designated with identical reference numerals, have identical or similar configurations.

Embodiment

Referring to FIG. 1, the configuration of a communication module 1 according to the present embodiment will be described.

FIG. 1 is a diagram illustrating an exemplary circuit configuration of a communication module according to the present embodiment. For example, the communication module 1, which is included in a portable terminal, is used for reception/transmission of data, such as sounds, images, and moving pictures, from/to a base station. The communication module 1 is compatible with multiple frequency bands of radio frequency (RF: Radio Frequency). The communication module 1 is compatible with multiple communication methods (multiple modes), such as the third-generation wireless communication system (3G) and the fourth-generation wireless communication system (4G). The communication methods, with which the communication module 1 is compatible, are not limited to these. For example, the communication module 1 may be compatible with the second-generation wireless communication system (2G) and the fifth-generation wireless communication system (5G). The communication module 1 may be compatible with the carrier aggregation.

As illustrated in FIG. 1, the communication module 1 includes a transmit terminal 101, a power amplifying circuit 102, a transmit switch 103, a duplexer 104, an input/output switch 105, a transmit filter 106, a receive filter 107, a receive switch 108, a low noise amplifier circuit 109, a receive terminal 110, and matching circuits (MN: Matching Network) 111a, 111b, 111c, 111d, 111e, and 111f. The communication module 1 includes signal paths corresponding to the respective frequency bands. The duplexer 104 is compatible with one of the frequency bands with which the communication module 1 is compatible. The transmit filter 106 and the receive filter 107 are compatible with another one of the frequency bands with which the communication module 1 is compatible. To reduce the number of discrete components without necessarily reducing available frequency bands, the communication module 1 may include multiple duplexers.

The transmit terminal 101 receives an RF signal (transmit signal) from the outside of the communication module 1.

The power amplifying circuit 102 amplifies an RF signal, which is input to the transmit terminal 101, to a level necessary for transmission to a base station, and outputs the amplified signal to the transmit switch 103.

The transmit switch 103 is a switch for transmitting an RF signal, which is received from the power amplifying circuit 102, to the duplexer 104 or the transmit filter 106 in accordance with the frequency band. Specifically, when the transmit frequency is in a first frequency band, the transmit switch 103 connects the power amplifying circuit 102 to the matching circuit 111a electrically. Thus, the RF signal is transmitted to the duplexer 104 as a first transmit signal. Similarly, when the transmit frequency is in a second frequency band, the transmit switch 103 connects the power amplifying circuit 102 to the matching circuit 111d electrically. Thus, the RF signal is transmitted to the transmit filter 106 as a second transmit signal.

The duplexer 104, which is formed of a single integrated circuit chip, is compatible with the first frequency band. The first frequency band is, for example, Band 26 or Band 20 of LTE (Long Term Evolution). Band 26 is a frequency band in which the transmit frequency ranges from 814 MHz to 849 MHz and the receive frequency ranges from 859 MHz to 894 MHz. Band 20 is a frequency band in which the transmit frequency ranges from 832 MHz to 862 MHz and the receive frequency ranges from 791 MHz to 821 MHz.

The duplexer 104 includes a first transmit terminal 104T, a first receive terminal 104R, and a first switching terminal 104A. The first transmit terminal 104T receives the first transmit signal which is output by the transmit switch 103. The first receive terminal 104R outputs a signal of a first receive frequency, which is included in the first frequency band, from a first receive signal that is input to the first switching terminal 104A by the input/output switch 105. The first switching terminal 104A outputs, to the input/output switch 105, a signal of a first transmit frequency, which is included in the first frequency band, from the first transmit signal that is input to the first transmit terminal 104T. The first switching terminal 104A receives the first receive signal which is output by the input/output switch 105.

The input/output switch 105 switches between the signal paths for transmit signals and receive signals in accordance with their frequency bands. In the present embodiment, the input/output switch 105 switches between the signal path for a transmit signal, which is output to an antenna 200 connected electrically to the communication module 1, and the signal path for a receive signal, which is input from the antenna 200, in accordance with the frequency bands of the transmit signal and the receive signal. Specifically, the input/output switch 105 connects the antenna 200 to the duplexer 104 or connects the antenna 200 to the transmit filter 106 and the receive filter 107 in accordance with the frequency band of an RF signal.

Specifically, in communication in the first frequency band, the input/output switch 105 connects the antenna 200 to the first switching terminal 104A of the duplexer 104 electrically, thus transmitting, to the antenna 200, a signal of the first transmit frequency which is output from the first switching terminal 104A of the duplexer 104. Alternatively, the input/output switch 105 connects the antenna 200 to the first switching terminal 104A of the duplexer 104 electrically, thus transmitting, to the duplexer 104, a signal of the first receive frequency which is output from the antenna 200.

In communication in the second frequency band, the input/output switch 105 connects the antenna 200 to a second switching terminal 106A of the transmit filter 106 electrically, thus transmitting, to the antenna 200, a signal of the second transmit frequency which is output from the second switching terminal 106A of the transmit filter 106. Alternatively, the input/output switch 105 connects the antenna 200 to a third switching terminal 107A of the receive filter 107 electrically, thus transmitting, to the receive filter 107, a signal of the second receive frequency which is output from the antenna 200.

In the present embodiment, the input/output switch 105 switches between the signal paths to the antenna 200 which is connected to the communication module 1 electrically. However, the connection target of the input/output switch 105 is not limited to the antenna 200. For example, the input/output switch 105 may be connected to a coaxial cable or the like. In the example in FIG. 1, the antenna 200 is provided outside the communication module 1, but may be incorporated inside the communication module 1.

The transmit filter 106 and the receive filter 107 are compatible with the second frequency band. The second frequency band is, for example, Band 13 of LTE. Band 13 is a frequency band in which the transmit frequency ranges from 777 MHz to 787 MHz and the receive frequency ranges from 746 MHz to 756 MHz. For example, in order that the communication module 1 is to be compatible with a band in which characteristics required for a transmit terminal are different from those for a receive terminal by a large extent, the transmit filter 106 and the receive filter 107 are formed with separate integrated circuit chips.

The transmit filter 106 includes a second transmit terminal 106T and the second switching terminal 106A. The second transmit terminal 106T receives the second transmit signal which is output by the transmit switch 103. The transmit filter 106 outputs, from the second switching terminal 106A, a signal of the second transmit frequency from the second transmit signal which is input to the second transmit terminal 106T.

The receive filter 107 includes a second receive terminal 107R and the third switching terminal 107A. The third switching terminal 107A receives a second receive signal which is output by the input/output switch 105. The receive filter 107 outputs a signal of the second receive frequency from the second receive signal which is input to the third switching terminal 107A.

The transmit filter 106 and the receive filter 107 function as a single duplexer, and thus may be regarded as a duplexer formed of two integrated circuit chips. In the case where a pair of the transmit filter 106 and the receive filter 107 thus functions as a duplexer, it is desirable to dispose the transmit filter 106 and the receive filter 107 at positions far from each other in terms of improvement of the isolation characteristics.

The receive switch 108 is a switch that transmits an RF signal received from the duplexer 104 or an RF signal received from the receive filter 107, to the low noise amplifier circuit 109. Specifically, in the case where the receive frequency is in the first frequency band, the receive switch 108 connects the first receive terminal 104R of the duplexer 104 to the low noise amplifier circuit 109 electrically. Similarly, in the case where the receive frequency is in the second frequency band, the receive switch 108 connects the second receive terminal 107R of the receive filter 107 to the low noise amplifier circuit 109 electrically.

The low noise amplifier circuit 109 amplifies the first receive signal or the second receive signal, which is output by the receive switch 108, to a level necessary for demodulation, and outputs the amplified signal to the receive terminal 110.

The receive terminal 110 transmits the signal, which is output by the low noise amplifier circuit 109, to the outside of the communication module 1.

The matching circuits 111a, 111b, 111c, 111d, 111e, and 111f match circuit impedance. Specifically, the matching circuit 111a matches the output impedance of the transmit switch 103 with the input impedance of the first transmit terminal 104T of the duplexer 104. Similarly, the matching circuit 111b matches the output impedance of the first switching terminal 104A of the duplexer 104 with the input impedance of the input/output switch 105. The matching circuit 111c matches the output impedance of the first receive terminal 104R of the duplexer 104 with the input impedance of the receive switch 108. The matching circuit 111d matches the output impedance of the transmit switch 103 with the input impedance of the second transmit terminal 106T of the transmit filter 106. The matching circuit 111e matches the output impedance of the input/output switch 105 with the input impedance of the second switch terminal 106A of the transmit filter 106 or the input impedance of the third switching terminal 107A of the receive filter 107. The matching circuit 111f matches the output impedance of the second receive terminal 107R of the receive filter 107 with the input impedance of the receive switch 108.

Figure 2:
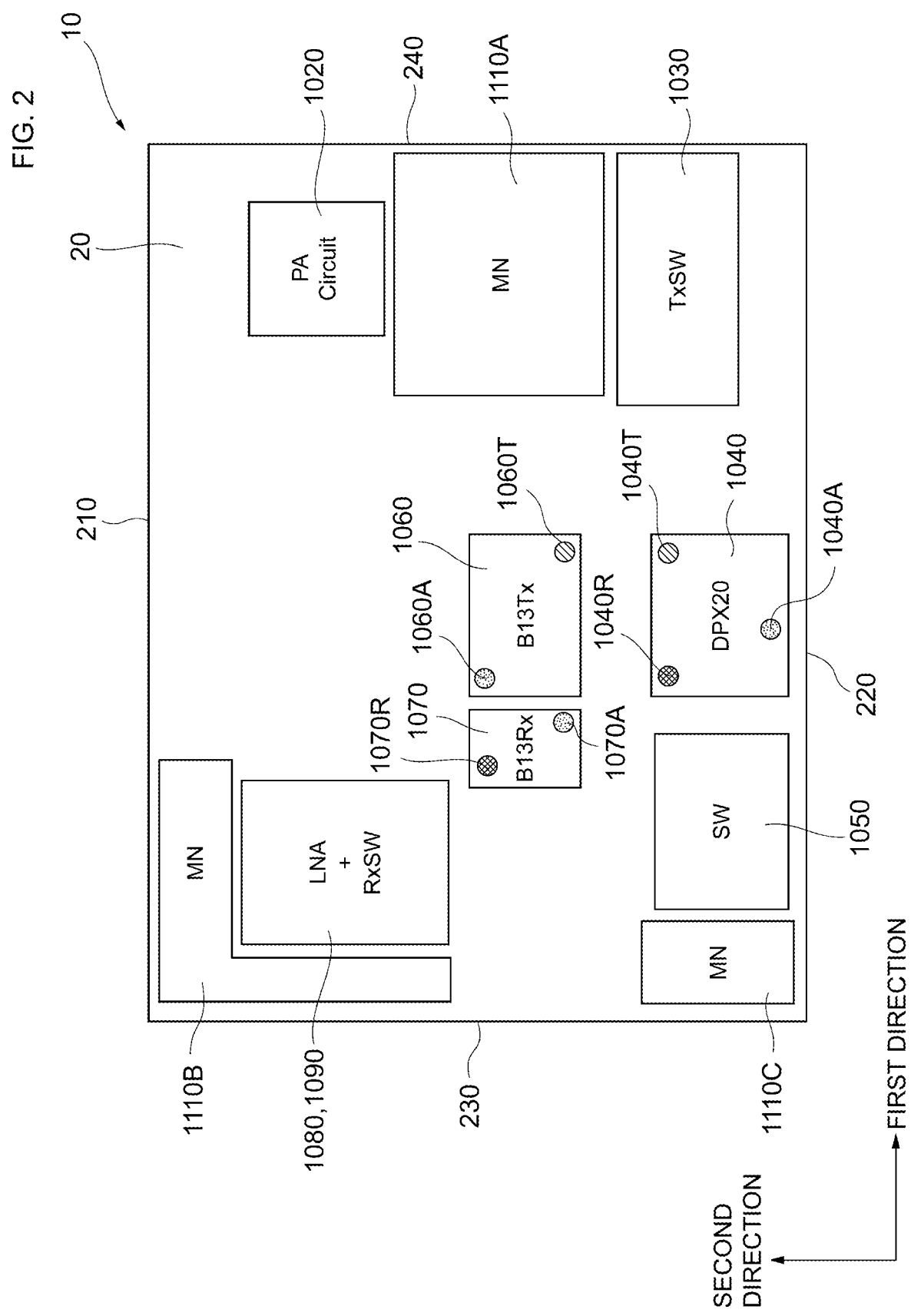
FIG. 2 is a diagram illustrating an exemplary arrangement of components of a communication module according to a comparison example.

Referring to FIG. 2, the arrangement of components of a communication module according to a comparison example will be described below.

FIG. 2 is a diagram illustrating an exemplary arrangement of components of a communication module according to a comparison example. As illustrated in FIG. 2, a communication module 10 according to the comparison example includes a power amplifying circuit 1020, a transmit switch 1030, a duplexer 1040, an input/output switch 1050, a transmit filter 1060, a receive filter 1070, a receive switch 1080, a low noise amplifier circuit 1090, matching-circuit allocation areas 1110A, 1110B, and 1110C which are disposed on a substrate 20. The matching-circuit allocation areas 1110A, 1110B, and 1110C are areas in which matching circuits are disposed.

As illustrated in FIG. 2, the substrate 20 is a rectangular substrate in which a pair of opposing sides are parallel to each other in a first direction and the other pair of opposing sides are parallel to each other in a second direction orthogonal to the first direction.

The matching-circuit allocation area 1110C is formed in one of the four corners of the substrate 20. The input/output switch 1050 is formed adjacent to the matching-circuit allocation area 1110C in the first direction.

The duplexer 1040 is disposed adjacent to the input/output switch 1050 in the first direction. In the present embodiment, the expression, 'the duplexer 1040 is disposed "adjacent to" the input/output switch 1050', indicates the state in which no other duplexers or filters are disposed between the duplexer 1040 and the input/output switch 1050. That is, other components such as surface mount devices (SMDs) may be disposed between the duplexer 1040 and the input/output switch 1050. The same is true for other embodiments. The duplexer 1040 includes a first transmit terminal 1040T, a first receive terminal 1040R, and a first switching terminal 1040A. The first transmit terminal 1040T is disposed in a corner, which is far from the input/output switch 1050 and is far from an edge of the substrate 20, among the four corners of the duplexer 1040. The first receive terminal 1040R is disposed in a corner, which is near the input/output switch 1050 and is far from the edge of the substrate 20, among the four corners of the duplexer 1040. The first switching terminal 1040A is disposed near a side, which is closer to the edge of the substrate 20, among the sides of the duplexer 1040 which are parallel to each other in the first direction.

The transmit switch 1030 is disposed in the first direction relative to the duplexer 1040.

The transmit filter 1060 is disposed in the second direction relative to the duplexer 1040. The receive filter 1070 is disposed in the second direction relative to the input/output switch 1050. The transmit filter 1060 and the receive filter 1070 are adjacent to each other in the first direction.

The transmit filter 1060 includes a second transmit terminal 1060T and a second switching terminal 1060A. The second transmit terminal 1060T is disposed in the vicinity of a corner, which is close to the duplexer and is far from the receive filter 1070, among the four corners of the transmit filter 1060. The second switching terminal 1060A is disposed in the vicinity of a corner, which is far from the duplexer 1040 and is close to the receive filter 1070, among the four corners of the transmit filter 1060.

The receive filter 1070 includes a second receive terminal 1070R and a third switching terminal 1070A. The second receive terminal 1070R is disposed in a corner, which is far from the input/output switch 1050 and is far from the transmit filter 1060, among the four corners of the receive filter 1070. The third switching terminal 1070A is disposed in a corner, which is close to the input/output switch 1050 and is close to the transmit filter 1060, among the four corners of the receive filter 1070.

The matching-circuit allocation area 1110A is formed so as to be disposed in the first direction relative to the transmit filter 1060 and be adjacent to the transmit switch 1030 in the second direction.

The receive switch 1080 and the low noise amplifier circuit 1090 are disposed in the second direction relative to the input/output switch 1050. The power amplifying circuit 1020 is disposed in the first direction relative to the receive switch 1080 and the low noise amplifier circuit 1090, and is disposed adjacent to the matching-circuit allocation area 1110A in the second direction. The matching-circuit allocation area 1110B is formed between the receive switch 1080 and the low noise amplifier circuit 1090, and the two sides forming one of the four corners of the substrate 20. The two sides are opposite, in the second direction, one of the four corners in which the matching-circuit allocation area 1110C is formed.

In the area in which the power amplifying circuit 1020, the transmit switch 1030, the duplexer 1040, the input/output switch 1050, the transmit filter 1060, the receive filter 1070, the receive switch 1080, and the low noise amplifier circuit 1090 are not disposed, for example, duplexers and other electronic components may be disposed. The areas in which the matching-circuit allocation areas 1110A, 1110B, and 1110C are formed are not particularly limiting.

In the communication module 10 according to the comparison example, the input/output switch 1050 and the duplexer 1040 are disposed adjacent to each other in the first direction, and the first receive terminal 1040R of the duplexer 1040 is disposed in a corner, which is close to the input/output switch 1050, among the four corners of the duplexer 1040. That is, in the communication module according to the comparison example, the first receive terminal 1040R of the duplexer 1040 is disposed at a short distance from the input/output switch 1050.

Thus, a signal transmitted from the first transmit terminal 1040T may leak through the input/output switch 1050 to the first receive terminal 1040R, resulting in reduction in the receiver sensitivity of the first receive terminal 1040R. That is, the isolation characteristics between the first transmit terminal 1040T and the first receive terminal 1040R may be degraded.

Figure 3:
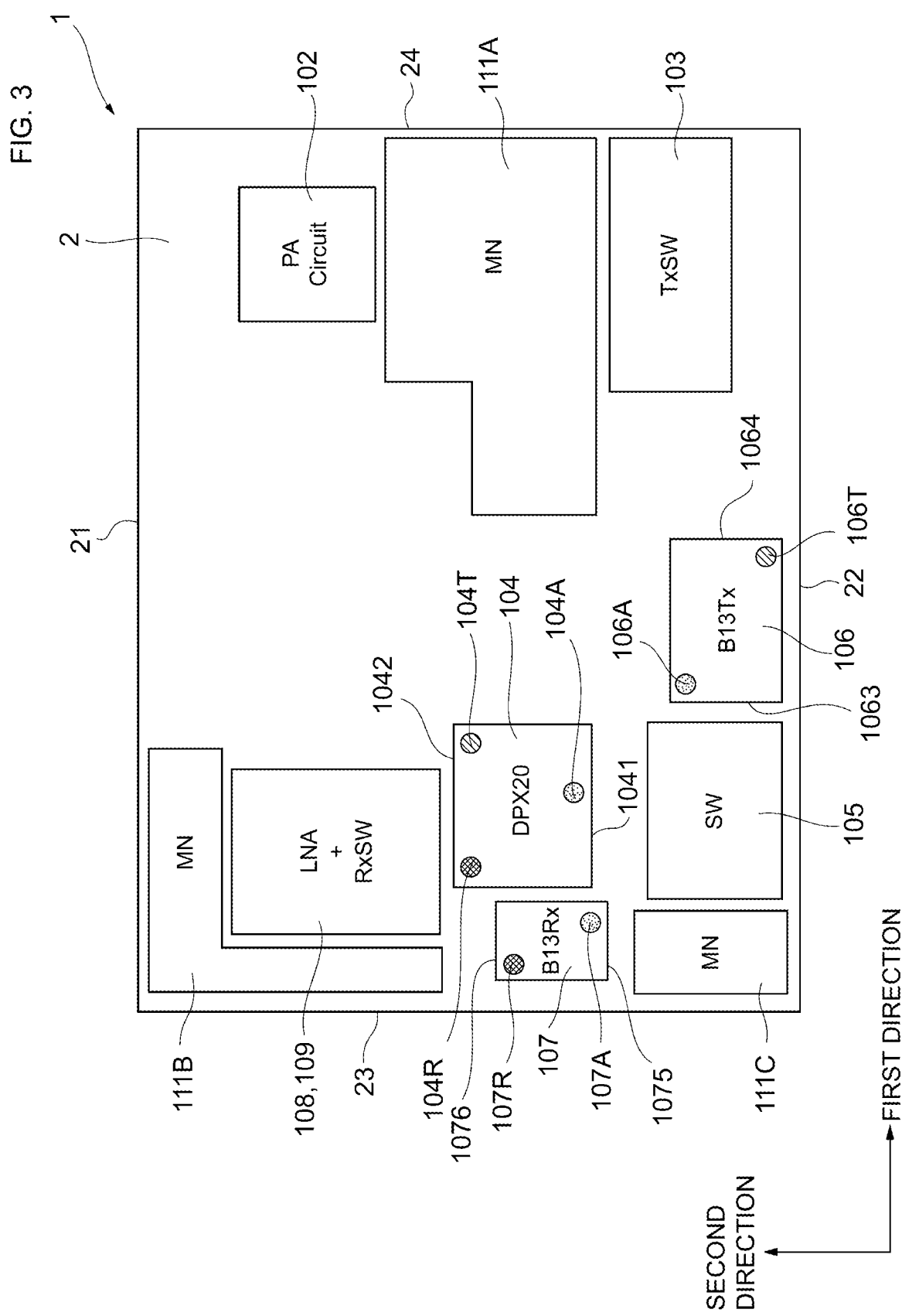
FIG. 3 is a diagram illustrating an exemplary arrangement of components of a communication module according to the present embodiment.
Figure 4:
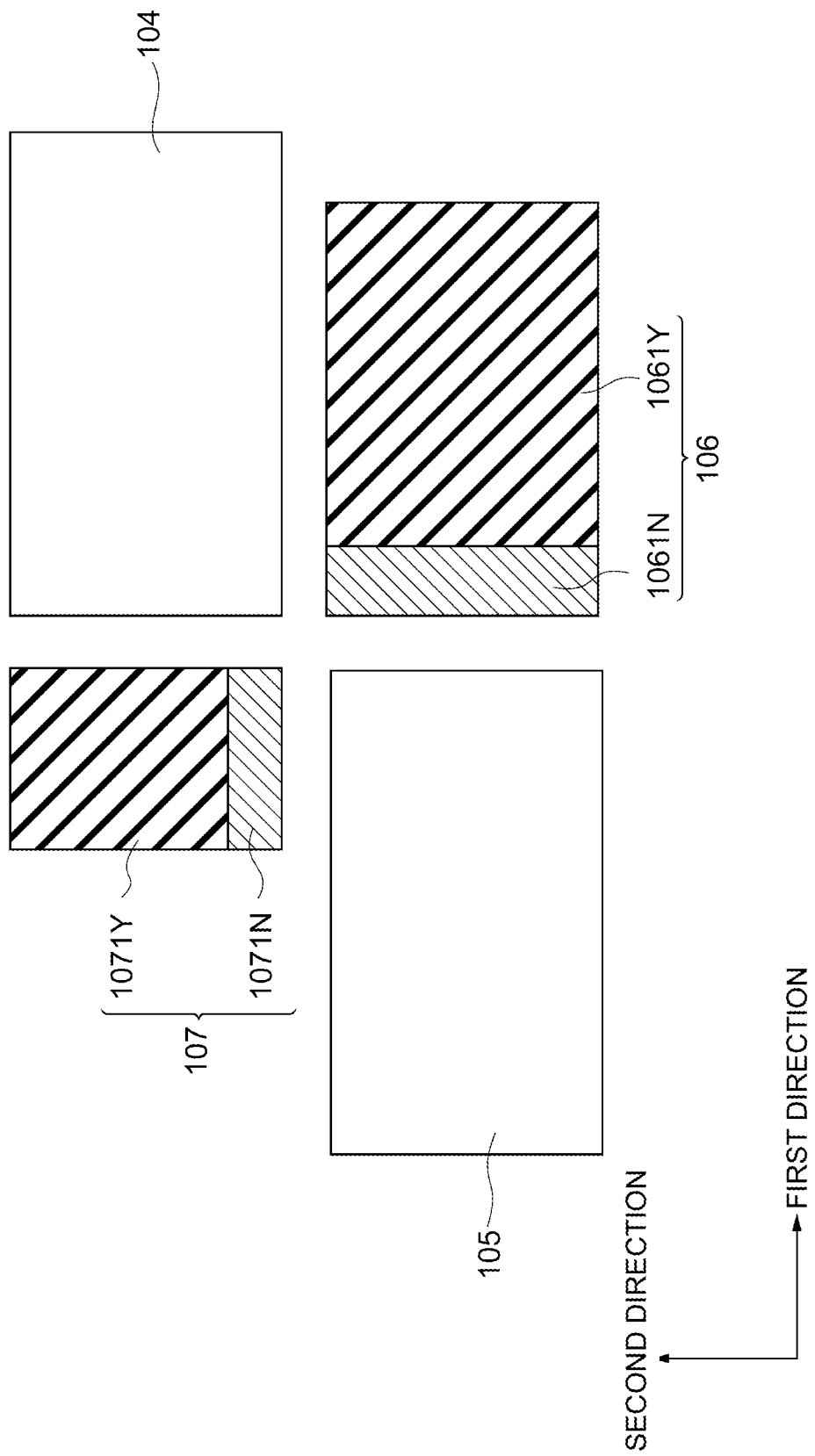
FIG. 4 is a diagram for describing the arrangement of a second transmit terminal in a transmit filter and the arrangement of a second receive terminal in a receive filter, according to the present embodiment.
Figure 5:
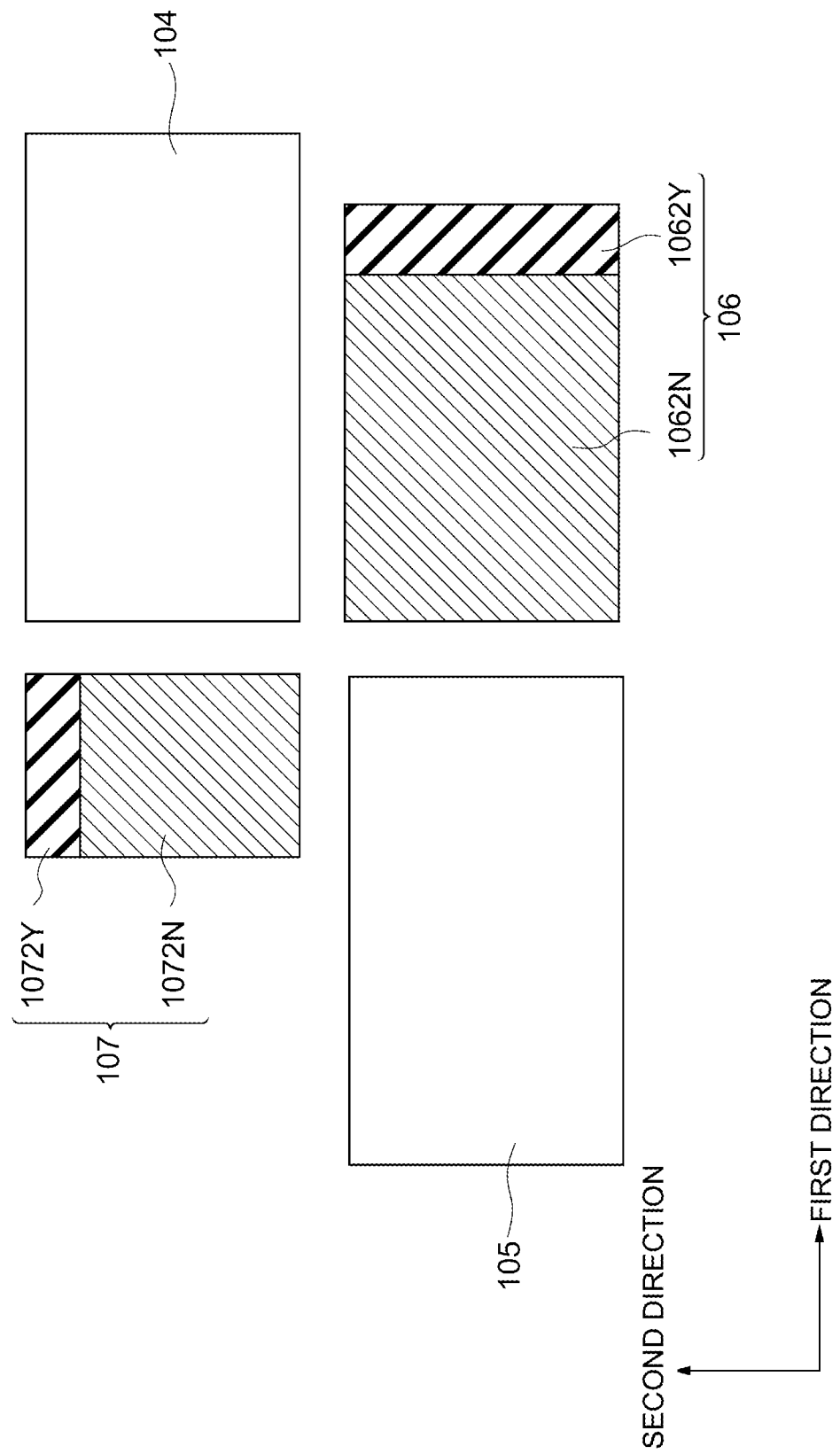
FIG. 5 is a diagram for describing the arrangement of a second transmit terminal in a transmit filter and the arrangement of a second receive terminal in a receive filter, according to the present embodiment.
Figure 6:
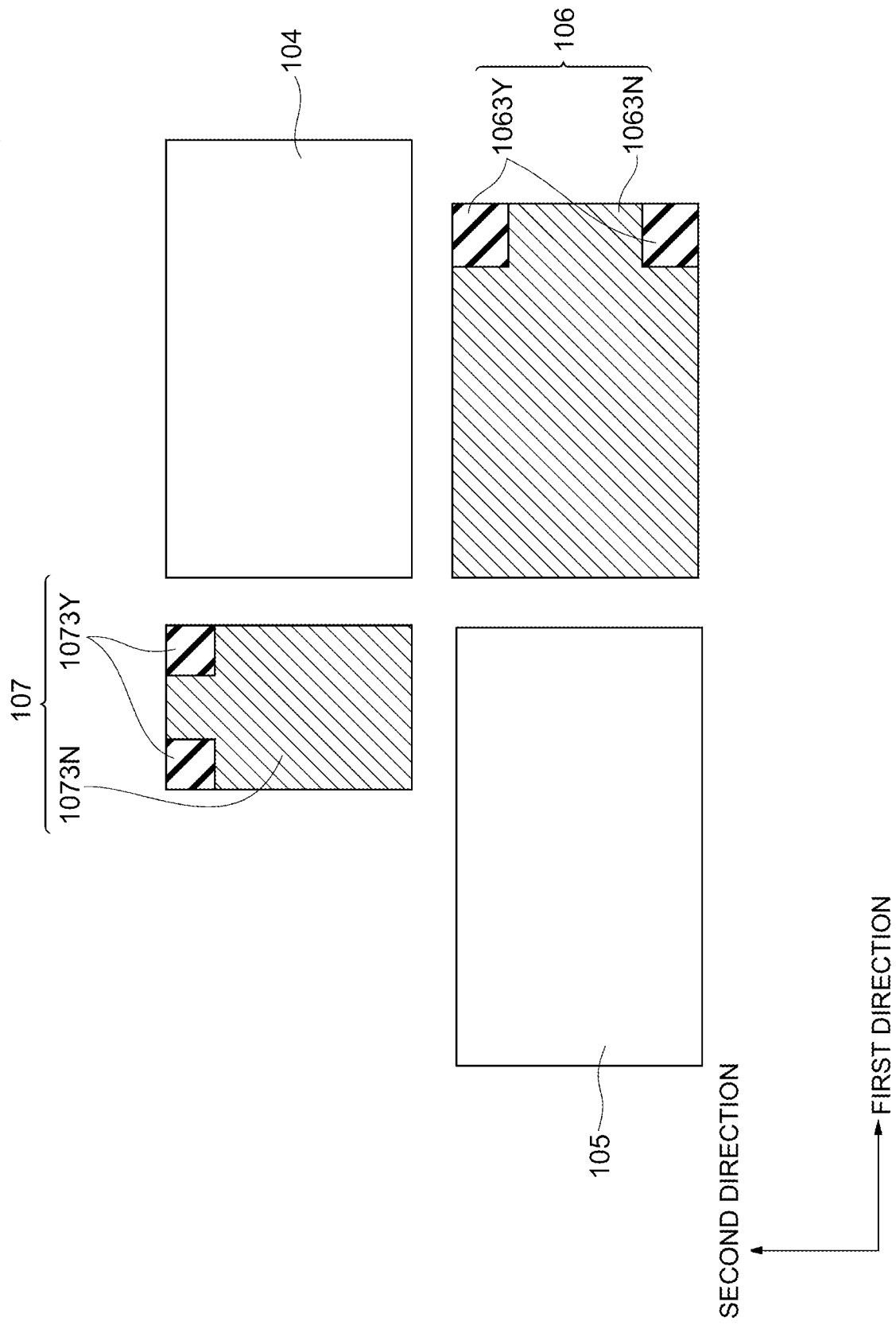
FIG. 6 is a diagram for describing the arrangement of a second transmit terminal in a transmit filter and the arrangement of a second receive terminal in a receive filter, according to the present embodiment.

Referring to FIGS. 3 to 6, the arrangement of components of a communication module according to the present embodiment, the arrangement of a second transmit terminal of a transmit filter according to the present embodiment, and the arrangement of a second receive terminal of a receive filter according to the present embodiment will be described below. FIG. 3 is a diagram illustrating an exemplary arrangement of components of a communication module according to the present embodiment. FIGS. 4, 5, and 6 are diagrams for describing the arrangement of a second transmit terminal of a transmit filter and the arrangement of a second receive terminal of a receive filter according to the present embodiment.

As illustrated in FIG. 3, the communication module 1 according to the present embodiment includes the power amplifying circuit 102, the transmit switch 103, the duplexer 104, the input/output switch 105, the transmit filter 106, the receive filter 107, the receive switch 108, the low noise amplifier circuit 109, and matching-circuit allocation areas 111A, 111B, and 111C, which are disposed on a substrate 2. The matching-circuit allocation areas 111A, 111B, and 111C are areas in which the matching circuits are formed.

As illustrated in FIG. 3, the substrate 2 is a rectangular substrate in which a pair of opposing sides are parallel to each other in the first direction and the other pair of opposing sides are parallel to each other in the second direction orthogonal to the first direction.

As illustrated in FIG. 3, the matching-circuit allocation area 111C is formed in one of the four corners of the substrate 2. The input/output switch 105 is disposed adjacent to the matching-circuit allocation area 111C in the first direction.

As illustrated in FIG. 3, the transmit filter 106 has a third side 1063 and a fourth side 1064 parallel to each other in the second direction. The fourth side 1064 is farther from the input/output switch 105 than the third side 1063. The transmit filter 106 is adjacent, in the first direction, to the side of the input/output switch 105 which is opposite the side adjacent to the matching-circuit allocation area 111C. That is, the third side 1063 is disposed adjacent to the input/output switch 105. In terms of improvement of isolation of the second frequency band, the second transmit terminal 106T of the transmit filter 106 is disposed in one, which is farther from the duplexer 104, of the end areas of the fourth side 1064. In terms of suppressing the transmission loss by shortening the wires connecting the input/output switch 105, the transmit filter 106, and the receive filter 107, the second switching terminal 106A of the transmit filter 106 is disposed in one, which is close to the duplexer 104, of the end areas of the third side 1063.

The areas in which the second transmit terminal 106T and the second switching terminal 106A are disposed in the transmit filter 106 are not limited to the arrangement illustrated in FIG. 3. For example, as illustrated in FIG. 4, the second transmit terminal 106T may be disposed in an area 1061Y rather than an area 1061N which is an end portion on the input/output switch 105 side, and the second switching terminal 106A may be disposed in the area 1061N. As illustrated in FIG. 5, the second transmit terminal 106T may be disposed in an area 1062Y which is an end portion which is located opposite the input/output switch 105 side, and the second switching terminal 106A may be disposed in an area 1062N rather than the area 1062Y. Alternatively, as illustrated in FIG. 6, the second transmit terminal 106T may be disposed in one of areas 1063Y which are corner portions which are located opposite the input/output switch 105 side, and the second switching terminal 106A may be disposed in an area 1063N rather than the areas 1063Y.

The areas in which the second receive terminal 107R and the third switching terminal 107A are disposed in the receive filter 107 are not limited to the arrangement illustrated in FIG. 3. For example, as illustrated in FIG. 4, the second receive terminal 107R may be disposed in an area 1071Y rather than an area 1071N which is an end portion on the input/output switch 105 side, and the third switching terminal 107A may be disposed in the area 1071N. As illustrated in FIG. 5, the second receive terminal 107R may be disposed in an area 1072Y which is an end portion which is located opposite the input/output switch 105 side, and the third switching terminal 107A may be disposed in an area 1072N rather than the area 1072Y. Alternatively, as illustrated in FIG. 6, the second receive terminal 107R may be disposed in one of areas 1073Y which are corner portions located opposite the input/output switch 105 side, and the third switching terminal 107A may be disposed in an area 1073N rather than the areas 1073Y.

As illustrated in FIG. 3, the transmit switch 103 is disposed in the first direction relative to the transmit filter 106.

As illustrated in FIG. 3, the receive filter 107 has a fifth side 1075 and a sixth side 1076 which are parallel to each other in the first direction. The sixth side 1076 is farther from the input/output switch 105 than the fifth side 1075. The receive filter 107 is disposed in the second direction relative to the input/output switch 105. That is, the sixth side 1076 is disposed at a position farther from the input/output switch 105 than the fifth side 1075 in the second direction. The receive filter 107 is disposed adjacent to the duplexer 104 in the first direction. For example, as illustrated in FIG. 3, the receive filter 107 may be disposed, in the second direction, between the matching-circuit allocation area 111C, and the receive switch 108 and the low noise amplifier circuit 109. Alternatively, the receive filter 107 may be disposed in the first direction relative to the duplexer 104, and may be disposed in the second direction relative to the transmit filter 106. In this case, for example, other duplexers may be disposed between the matching-circuit allocation area 111C, and the receive switch 108 and the low noise amplifier circuit 109. The receive filter 107 is disposed on the opposite side of the transmit filter 106 relative to the input/output switch 105 and the duplexer 104. In other words, the receive filter 107 and the transmit filter 106 are separated from each other by using the input/output switch 105 and the duplexer 104. As illustrated in FIG. 3, the transmit filter 106 may be disposed on one side relative to the input/output switch 105 and the duplexer 104 in the first direction, and the receive filter 107 may be disposed on the other side relative to the input/output switch 105 and the duplexer 104 in the first direction. As illustrated in FIGS. 4 to 6, the transmit filter 106 may be disposed on a first first-direction side relative to the input/output switch 105 and on a first second-direction side relative to the duplexer 104, and the receive filter 107 may be disposed on a second second-direction side relative to the input/output switch 105 and on a second first-direction side relative to the duplexer 104.

In terms of improvement of isolation of the second frequency band, the second receive terminal 107R of the receive filter 107 is disposed in one, which is farther from the duplexer 104, of the end areas of the sixth side 107б. In terms of suppressing the transmission loss by shortening wires connecting the input/output switch 105, the transmit filter 106, and the receive filter 107, the third switching terminal 107A of the receive filter 107 is disposed in one, which is closer to the duplexer 104, of the end areas of the fifth side 1075.

As illustrated in FIG. 3, the duplexer 104 has a first side 1041 and a second side 1042 which are parallel to each other in the first direction. The second side 1042 is farther from the input/output switch 105 than the first side 1041. The duplexer 104 is disposed at a position, in the second direction, at which the second side 1042 is farther from the input/output switch 105 than the first side 1041. For example, as illustrated in FIG. 3, the duplexer 104 may be disposed between the input/output switch 105, and the receive switch 108 and the low noise amplifier circuit 109 in the second direction. Alternatively, the duplexer 104 may be disposed in the second direction relative to the transmit filter 106. In addition to the duplexer 104, another duplexer may be disposed in the second direction relative to the transmit filter 106. For example, another duplexer may be disposed between the duplexer 104 and the transmit filter 106.

The first transmit terminal 104T of the duplexer 104 is disposed on the second side 1042 side and at a position farther from the receive filter 107. The first receive terminal 104R of the duplexer 104 is disposed on the second side 1042 side and at a position closer to the receive filter 107. The first switching terminal 104A of the duplexer 104 is disposed on the first side 1041 side.

As illustrated in FIG. 3, the matching-circuit allocation area 111A is formed in the first direction relative to the duplexer 104, and is adjacent to the transmit switch 103 in the second direction. The receive switch 108 and the low noise amplifier circuit 109 are disposed in the second direction relative to the input/output switch 105. The power amplifying circuit 102 is disposed in the first direction relative to the receive switch 108 and the low noise amplifier circuit 109, and is adjacent to the matching-circuit allocation area 111A in the second direction. The matching-circuit allocation area 111B is formed between the receive switch 108 and the low noise amplifier circuit 109, and the two sides forming one of the four corners of the substrate 2. The two sides are opposite, in the second direction, one of the four corners in which the matching-circuit allocation area 111C is formed.

In the area in which the power amplifying circuit 102, the transmit switch 103, the duplexer 104, the input/output switch 105, the transmit filter 106, the receive filter 107, the receive switch 108, and the low noise amplifier circuit 1090 are not disposed, for example, duplexers and other electronic components may be disposed. The areas in which the matching-circuit allocation areas 111A, 111B, and 111C are formed are not particularly limiting.

Figure 7:
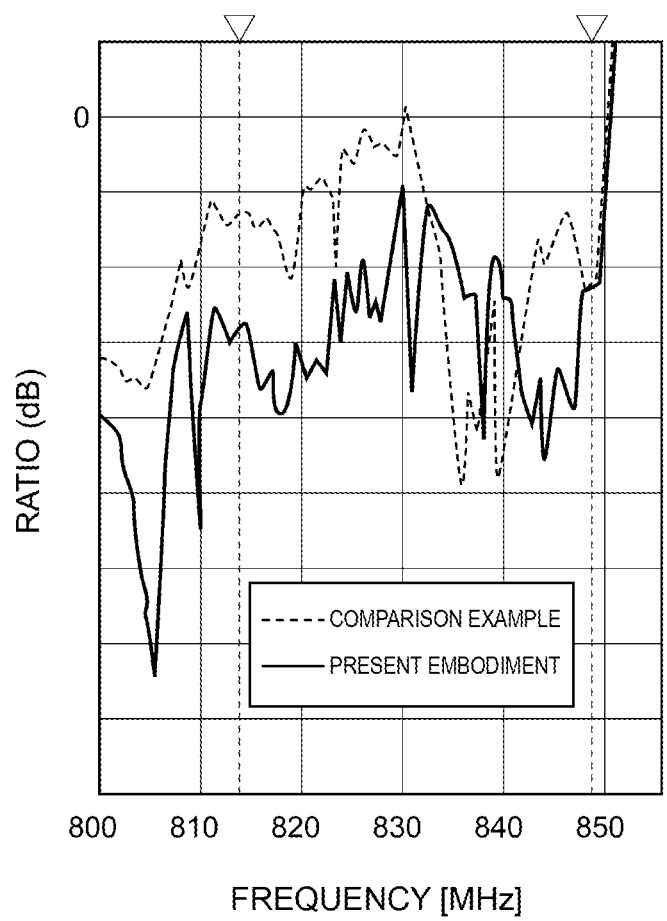
FIG. 7 is a graph illustrating the ratio obtained through quantification of isolation characteristics between the transmit terminal and the receive terminal of a duplexer of a communication module according to a comparison example and illustrating the ratio for a communication module according to the present embodiment.
Figure 8:
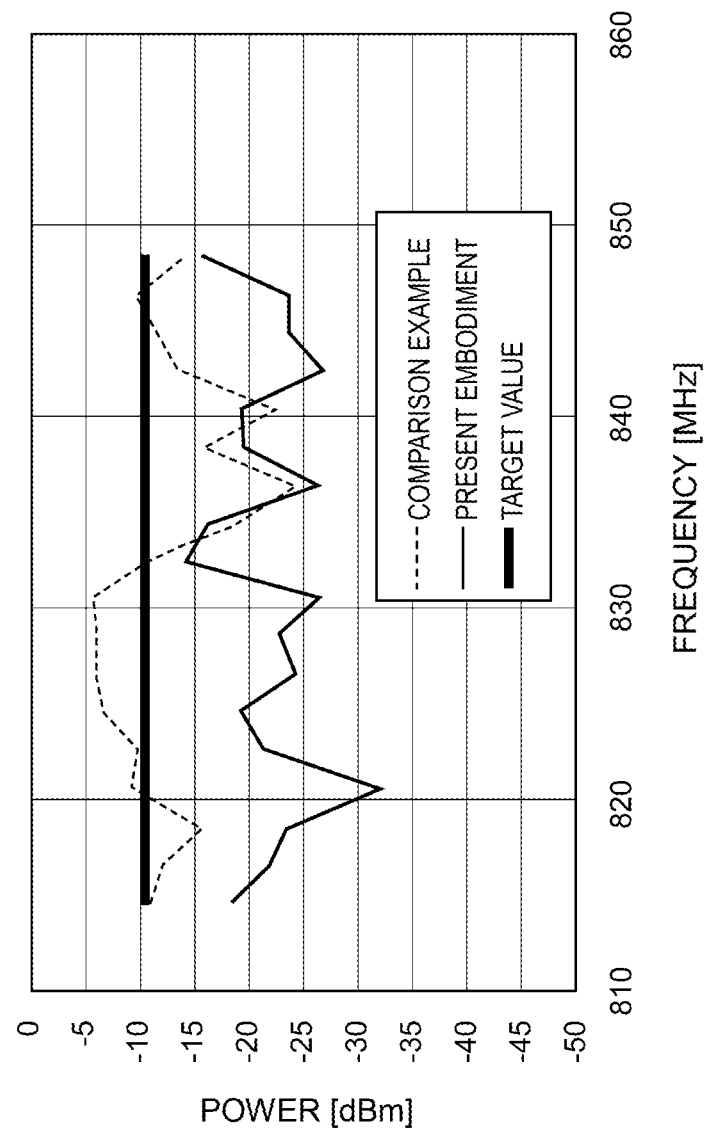
FIG. 8 is a graph illustrating the power obtained through quantification of isolation characteristics between the transmit terminal and the receive terminal of a duplexer of a communication module according to a comparison example and illustrating that for a communication module according to the present embodiment.

Referring to FIGS. 7 and 8, isolation characteristics between the transmit terminal and the receive terminal of a duplexer in a communication module according to the comparison example and those for a communication module according to the present embodiment will be described below. FIG. 7 is a graph illustrating the ratio obtained through quantification of the isolation characteristics between the transmit terminal and the receive terminal of a duplexer in a communication module according to the comparison example and that for the communication module according to the present embodiment. FIG. 8 is a graph illustrating the power obtained through quantification of the isolation characteristics between the transmit terminal and the receive terminal of a duplexer in a communication module according to the comparison example and that for a communication module according to the present embodiment. The horizontal axis in FIGS. 7 and 8 indicates the transmit frequency of Band 26.

The isolation characteristics herein mean the amount of power leaking from the transmit terminal 101 to the receive terminal 110. The isolation characteristics are higher as the amount of leaking power is smaller; the isolation characteristics are lower as the amount of leaking power is larger. That is, as the amount of leaking power is larger, the isolation characteristics become close to zero. As the amount of leaking power is lower, the isolation characteristics go down from zero.

As illustrated in FIGS. 7 and 8, the communication module 1 (solid line) according to the present embodiment has isolation characteristics higher than those of the communication module 10 according to the comparison example (dotted line). This is because, in the duplexer 104 of the communication module 1 according to the present embodiment, the second side 1042, which is closest to the first receive terminal 104R, is disposed, in the second direction, at a position farther from the input/output switch 105 than the first side 1041 which is closest to the input/output switch 105. Thus, the distance between the input/output switch 105 and the first receive terminal 104R of the duplexer 104 is relatively long, whereas, in the communication module 10 according to the comparison example, the distance between the input/output switch 1050 and the first receive terminal 1040R of the duplexer 1040 is relatively short.

As described above, according to one aspect of the present disclosure, there is provided a communication module 1 including an input/output switch 105, a duplexer 104, a transmit filter 106, and a receive filter 107. The input/output switch 105 switches between signal paths for transmit signals and receive signals in accordance with frequency bands of the transmit signals and the receive signals. The duplexer 104 has a first side 1041 and a second side 1042 parallel to each other in a first direction, and includes a first switching terminal 104A, a first transmit terminal 104T, and a first receive terminal 104R. The first switching terminal 104A is disposed on a side of the first side 1041. The first transmit terminal 104T is disposed on a side of the second side 1042. The first receive terminal 104R is disposed on the side of the second side 1042. A signal of a first transmit frequency included in a first frequency band is output from the first switching terminal 104A to the input/output switch 105. The signal of the first transmit frequency is obtained from a first transmit signal that is input to the first transmit terminal 104T. A signal of a first receive frequency included in the first frequency band is output from the first receive terminal 104R. The signal of the first receive frequency is obtained from a first receive signal that is input from the input/output switch 105 to the first switching terminal 104A. The transmit filter 106 includes a second switching terminal 106A and a second transmit terminal 106T. A signal of a second transmit frequency included in a second frequency band is output from the second switching terminal 106A to the input/output switch 105. The signal of the second transmit frequency is obtained from a second transmit signal that is input to the second transmit terminal 106T. The receive filter 107 includes a third switching terminal 107A and a second receive terminal 107R. A signal of a second receive frequency included in the second frequency band is output from the second receive terminal 107R. The signal of the second receive frequency is obtained from a second receive signal that is input from the input/output switch 105 to the third switching terminal 107A. In the duplexer 104, the second side 1042 is disposed at a position farther from the input/output switch 105 than the first side 1041 in a second direction orthogonal to the first direction. A first filter is disposed adjacent to the input/output switch 105 in the first direction. The first filter is any one of the transmit filter 106 and the receive filter 107.

According to the aspect, the first receive terminal 104R of the duplexer 104 is disposed far from the input/output switch 105, achieving suppression of leakage of a signal of the first transmit frequency through the input/output switch 105 to the first receive terminal 104R. Thus, the communication module 1 achieving improvement of isolation characteristics of the first frequency band may be provided.

In the communication module 1 according to the present embodiment, the duplexer 104 is disposed in the second direction relative to the input/output switch 105. This enables the transmit filter 106 to be disposed in the first direction relative to the input/output switch 105. That is, employment of the layout as in FIG. 3 enables the space on the substrate 2 to be used effectively.

In the communication module 1 according to the present disclosure, each of the duplexer 104, the transmit filter 106, and the receive filter 107 is formed of a corresponding single integrated circuit chip. This enables reduction in the number of discrete components necessary for isolation of a signal of the first frequency band. In contrast, two integrated circuit chips, the transmit filter 106 and the receive filter 107, are used for isolation of a signal of the second frequency band, achieving a wider range of choices with respect to the layout on the substrate 2. For example, the transmit filter 106 and the receive filter 107 may be disposed far apart.

A second filter may be disposed in the second direction relative to the input/output switch 105. The second filter is another one of the transmit filter 106 and the receive filter 107. This enables a wire connecting the input/output switch 105 to the transmit filter 106 to be disposed far from a wire connecting the input/output switch 105 to the receive filter 107. Thus, isolation characteristics of the second frequency band between the wires may be improved.

The receive filter 107 may be disposed on the opposite side of the transmit filter 106 relative to the duplexer 104. The transmit filter 106 is separated from the receive filter 107 by using the duplexer 104. Thus, leakage of a signal of the second frequency band between the transmit filter 106 and the receive filter 107 may be suppressed.

The communication module 1 may further include a transmit switch 103 and a receive switch 108. The transmit switch 103 may output the first transmit signal to the first transmit terminal 104T of the duplexer 104, or may output the second transmit signal to the second transmit terminal 106T of the transmit filter 106. The receive switch 108 may receive the signal of the first receive frequency from the first receive terminal 104R of the duplexer 104, or may receive the signal of the second receive frequency from the second receive terminal 107R of the receive filter 107. The transmit filter 106 and the transmit switch 103 may be disposed in the first direction relative to the input/output switch 105. The receive filter 107 and the receive switch 108 may be disposed in the second direction relative to the input/output switch 105. This achieves improvement of isolation characteristics of the second frequency band between the transmit switch 103 and the receive switch 108.

The transmit filter 106 may have a third side 1063 and a fourth side 1064 parallel to each other in the second direction. The second switching terminal 106A may be disposed on a side of the third side 1063. The second transmit terminal may be disposed on a side of the fourth side 1064. In the transmit filter 106, the third side 1063 is disposed adjacent to the input/output switch 105. This achieves improvement of isolation characteristics of the second frequency band between the input/output switch 105 and the second transmit terminal 106T. In addition, a wire connecting the input/output switch 105 to the second switching terminal 106A may be shortened, achieving reduction in the transmission loss.

The second transmit terminal 106T may be disposed in one of end areas of the fourth side 1064. In particular, when the second transmit terminal 106T is disposed in one, which is farther from the duplexer 104, of the end areas of the fourth side 1064, isolation characteristics between a wire connected to the second transmit terminal 106T and another signal path may be improved.

The receive filter 107 may have a fifth side 1075 and a sixth side 1076 parallel to each other in the first direction. The third switching terminal 107A may be disposed on a side of the fifth side 1075. The second receive terminal 107R may be disposed on a side of the sixth side 1076. In the receive filter 107, the sixth side 1076 may be disposed at a position farther from the input/output switch 105 than the fifth side 1075 in the second direction. This achieves improvement of isolation characteristics of the second frequency band between the input/output switch 105 and the second receive terminal 107R. In addition, a wire connecting the input/output switch 105 to the third switching terminal 107A may be shortened, achieving reduction in the transmission loss.

The second receive terminal 107R may be disposed in one of end areas of the sixth side 1076. In particular, when the second receive terminal 107R is disposed in one, which is farther from the duplexer 104, of the end areas of the sixth side 1076, isolation characteristics between a wire connected to the second receive terminal 107R and another signal path may be improved.

The communication module 1 may further include a receive switch 108 and a low noise amplifier circuit 109. The receive switch 108 may receive the signal of the first receive frequency from the first receive terminal 104R of the duplexer 104, or may receive the signal of the second receive frequency from the second receive terminal 107R of the receive filter 107. The low noise amplifier circuit 109 may amplify a signal transmitted from the receive switch 108. The duplexer 104 may be disposed between the input/output switch 105, and the receive switch 108 and the low noise amplifier circuit 109. This enables wires connecting the input/output switch 105, the duplexer 104, and the receive switch 108 to be shortened, achieving reduction in the transmission loss.

The duplexer 104 may be disposed in the second direction relative to the transmit filter 106.

The communication module 1 may further include a different duplexer that is disposed in the second direction relative to the transmit filter 106. This achieves reduction in the number of discrete components, compared with the case of having another pair of a transmit filter and a receive filter.

The communication module 1 may further include a matching-circuit allocation area 111C that is adjacent, in the first direction, to a side of the input/output switch 105. The side is opposite the side adjacent to the first filter. Thus, the arrangement, in which no duplexers are adjacent to both the sides of the input/output switch 105 in the first direction, achieves suppression of reduction, which is caused through the input/output switch 105, in isolation.

The embodiments described above facilitate understanding of the present disclosure, and do not intend limited interpretation of the present disclosure. The present disclosure may be changed/improved without necessarily departing from the gist of the present disclosure. In addition, the present disclosure encompasses its equivalence. That is, an embodiment, obtained by those skilled in the art changing the embodiments appropriately in terms of design, is encompassed in the scope of the present disclosure as long as the embodiment has the characteristics of the present disclosure. For example, the components included in the embodiments, and their arrangement, materials, conditions, shapes, sizes and the like are not limited to those described herein, and may be changed appropriately. The embodiments are exemplary. Needless to say, partial replacement or combination of the configurations of different embodiments is possible. These are encompassed in the scope of the present disclosure as long as they have the characteristics of the present disclosure.

REFERENCE SIGNS LIST

1, 10 communication module
2, 20 substrate
101 transmit terminal
102, 1020 power amplifying circuit
103, 1030 transmit switch
104, 1040 duplexer
105, 1050 input/output switch
106, 1060 transmit filter
107, 1070 receive filter
108, 1080 receive switch
109, 1090 low noise amplifier circuit
110 receive terminal
111a, 111b, 111c, 111d, 111e, 111f matching circuit
111A, 111B, 111C, 1110A, 1110B, 1110C matching-circuit allocation area
200 antenna

What is claimed is:

1. A communication module comprising:
   a first switch;
   a duplexer comprising a first switching terminal, a first transmit terminal, and a first receive terminal, the first switching terminal being electrically connected to the first switch;
   a transmit filter electrically connected to the first switch; and
   a receive filter electrically connected to the first switch,
   wherein the duplexer has a first side and a second side parallel to each other in a first direction,
   wherein the first transmit terminal and the first receive terminal are disposed closer to the second side than the first side,
   wherein the first switching terminal is disposed closer to the first side than the second side,
   wherein, in the communication module, the first switch is disposed closer to the first side than the second side in a second direction orthogonal to the first direction, and
   wherein a first of the transmit filter or the receive filter is disposed adjacent to the first switch in the first direction.

2. The communication module according to claim 1, wherein each of the duplexer, the transmit filter, and the receive filter are embodied as individual integrated circuit chips.

3. The communication module according to claim 1, wherein a second of the transmit filter or the receive filter is disposed in the second direction relative to the first switch.

4. The communication module according to claim 1, wherein the receive filter is disposed on an opposite side of the duplexer than the transmit filter.

5. The communication module according to claim 1, further comprising:
   a transmit switch configured to output a first transmit signal to the first transmit terminal of the duplexer, or to output a second transmit signal to the transmit filter; and
   a receive switch configured to receive a signal in a first receive frequency from the first receive terminal of the duplexer, or to receive a signal in a second receive frequency from the receive filter,
   wherein the transmit filter and the transmit switch are disposed in the first direction relative to the first switch, and
   wherein the receive filter and the receive switch are disposed in the second direction relative to the first switch.

6. The communication module according to claim 5,
   wherein the transmit filter has a third side and a fourth side parallel to each other in the second direction, and comprises a second transmit terminal electrically connected to the first switch,
   wherein a second switching terminal is disposed closer to the third side than the fourth side,
   wherein the second transmit terminal is disposed closer to the fourth side than the third side, and
   wherein, in the communication module, the first switch is disposed adjacent to the third side.

7. The communication module according to claim 6, wherein the second transmit terminal is disposed at an end of the fourth side.

8. The communication module according to claim 5,
wherein the receive filter has a fifth side and a sixth side parallel to each other in the first direction, and comprises a second receive terminal electrically connected to the first switch,
wherein a third switching terminal is disposed closer to the fifth side than the sixth side,
wherein the second receive terminal is disposed closer to the sixth side than the fifth side, and
wherein, in the communication module, the first switch is disposed closer to the fifth side than the sixth side in the second direction.

9. The communication module according to claim 8, wherein the second receive terminal is disposed at an end of the sixth side.

10. The communication module according to claim 1, further comprising:
a receive switch configured to receive a signal in a first receive frequency from the duplexer, or to receive a signal in a second receive frequency from the receive filter; and
a low noise amplifier circuit configured to amplify a signal transmitted from the receive switch,
wherein, in the communication module, the duplexer is disposed between the first switch, and the receive switch and the low noise amplifier circuit.

11. The communication module according to claim 1, wherein the duplexer is disposed in the second direction relative to the transmit filter.

12. The communication module according to claim 1, further comprising:
a second duplexer disposed in the second direction relative to the transmit filter.

13. The communication module according to claim 1, further comprising:
a matching circuit disposed adjacent, in the first direction, to a side of the first switch opposite a side adjacent to the first of the transmit filter or the receive filter.

14. A communication module comprising:
an input/output switch configured to selectively switch signal paths for transmit signals and receive signals in accordance with frequency bands of the transmit signals and the receive signals;
a duplexer that has a first side and a second side parallel to each other in a first direction, and that comprises a first switching terminal, a first transmit terminal, and a first receive terminal, the first switching terminal being disposed along the first side, the first transmit terminal being disposed along the second side, and the first receive terminal being disposed along the second side, wherein a first transmit signal of a first transmit frequency included in a first frequency band is input to the first transmit terminal and output from the first switching terminal to the input/output switch, and wherein a first receive signal of a first receive frequency included in the first frequency band is input from the input/output switch to the first switching terminal and output from the first receive terminal;
a transmit filter comprising a second switching terminal and a second transmit terminal, wherein a second transmit signal of a second transmit frequency included in a second frequency band is input to the second transmit terminal and output from the second switching terminal to the input/output switch; and
a receive filter comprising a third switching terminal and a second receive terminal, wherein a second receive signal of a second receive frequency included in the second frequency band is input from the input/output switch to the third switching terminal output from the second receive terminal,
wherein, in the communication module, the input/output switch is disposed closer to the first side than the second side in a second direction orthogonal to the first direction, and
wherein, in the communication module, the transmit filter or the receive filter is disposed adjacent to the input/output switch in the first direction.

* * * * *